US006911718B1

(12) United States Patent
Alegre et al.

(10) Patent No.: US 6,911,718 B1
(45) Date of Patent: Jun. 28, 2005

(54) DOUBLE DOWNSET DOUBLE DAMBAR SUSPENDED LEADFRAME

(75) Inventors: Sherwin Alegre, Cavite (PH); Rommel B. Romero, Laguna (PH); Febie Antivola, Paraflaque (PH); Jaime H. Echegoyen, Laguna (PH)

(73) Assignee: Amkor Technology, Inc., Chandler, AZ (US)

( * ) Notice: Subject to any disclaimer, the term of this patent is extended or adjusted under 35 U.S.C. 154(b) by 149 days.

(21) Appl. No.: 10/614,440

(22) Filed: Jul. 3, 2003

(51) Int. Cl.$^7$ .............................................. H01L 23/495
(52) U.S. Cl. .................... 257/666; 257/670; 257/679; 257/680; 438/123; 438/106
(58) Field of Search ................................ 257/666, 670, 257/676, 677, 679, 680, 81, 99, 678, 782, 783; 438/106, 118, 121, 123, 125; 235/487, 492

(56) References Cited

U.S. PATENT DOCUMENTS

| 3,668,299 | A |   | 6/1972  | Mc Neal          |         |
|-----------|---|---|---------|------------------|---------|
| 4,532,419 | A |   | 7/1985  | Takeda           |         |
| 4,905,124 | A |   | 2/1990  | Banjo et al.     |         |
| 4,974,120 | A |   | 11/1990 | Kodai et al.     |         |
| 5,172,214 | A |   | 12/1992 | Casto            |         |
| 5,360,992 | A |   | 11/1994 | Lowrey et al.    |         |
| 5,574,309 | A |   | 11/1996 | Papapietro et al.|         |
| 5,742,479 | A |   | 4/1998  | Asakura          |         |
| 5,753,532 | A |   | 5/1998  | Sim              |         |
| 5,784,259 | A |   | 7/1998  | Asakura          |         |
| 5,822,190 | A |   | 10/1998 | Iwasaki          |         |
| 5,977,613 | A |   | 11/1999 | Takata et al.    |         |
| 6,040,622 | A |   | 3/2000  | Wallace          |         |
| 6,060,339 | A | * | 5/2000  | Akram et al.     | 438/108 |
| 6,143,981 | A |   | 11/2000 | Glenn            |         |
| D445,096  | S |   | 7/2001  | Wallace          |         |
| D446,525  | S |   | 8/2001  | Okamoto et al.   |         |
| 6,384,472 | B1|   | 5/2002  | Huang            |         |
| 6,410,355 | B1| * | 6/2002  | Wallace          | 438/15  |
| 6,476,469 | B2|   | 11/2002 | Hung et al.      |         |
| 6,545,332 | B2|   | 4/2003  | Huang            |         |
| 6,603,196 | B2|   | 8/2003  | Lee et al.       |         |
| 6,624,005 | B1|   | 9/2003  | Di Caprio et al. |         |
| 2001/0052637 | A1| * | 12/2001 | Akram et al.  | 257/666 |
| 2002/0140068 | A1|   | 10/2002 | Lee            |         |

FOREIGN PATENT DOCUMENTS

| JP | 3112688  | 5/1991  |
| JP | 7017175  | 1/1995  |
| JP | 8190615  | 7/1996  |
| JP | 10334205 | 12/1998 |

* cited by examiner

Primary Examiner—David Nelms
Assistant Examiner—Long Tran
(74) Attorney, Agent, or Firm—Stetina Brunda Garred & Brucker

(57) ABSTRACT

In accordance with the present invention, there is provided a memory card which is fabricated through the use of a leadframe comprising an outer dambar defining a central opening, and an inner dambar which is disposed within the central opening. The leadframe further includes a plurality of contacts which are disposed within the central opening and attached to the outer dambar. Disposed within the central opening is at least one die pad, with a plurality of conductive traces extending from respective ones of the contacts toward the die pad. At least one tie bar is attached to and extends between the die pad and each of the outer and inner dambars. The tie bar has at least two downsets formed therein such that the die pad, the outer dambar, and the inner dambar extend along respective ones of at least three spaced, generally parallel planes, the plane of the inner dambar being disposed between the planes of the die pad and the outer dambar.

16 Claims, 2 Drawing Sheets

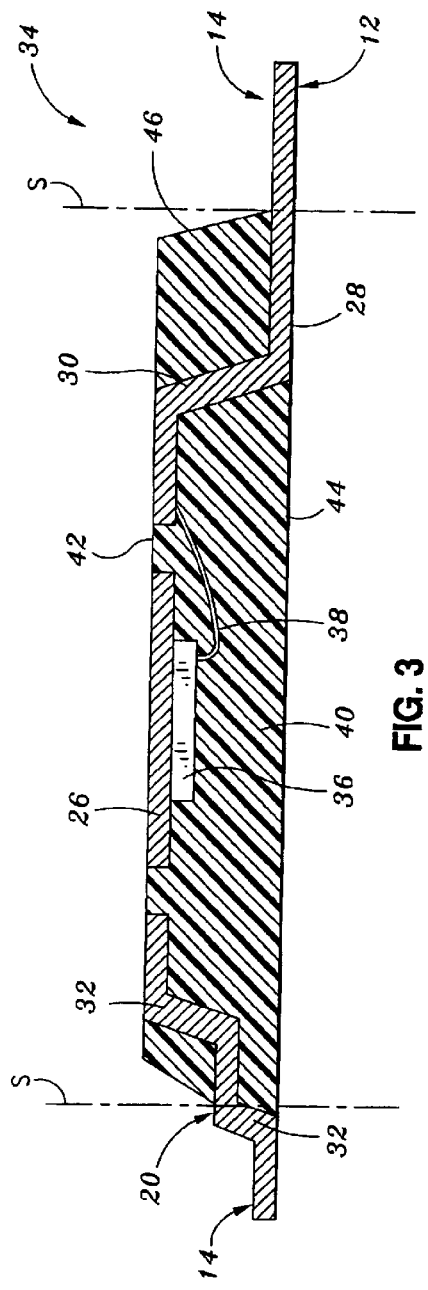
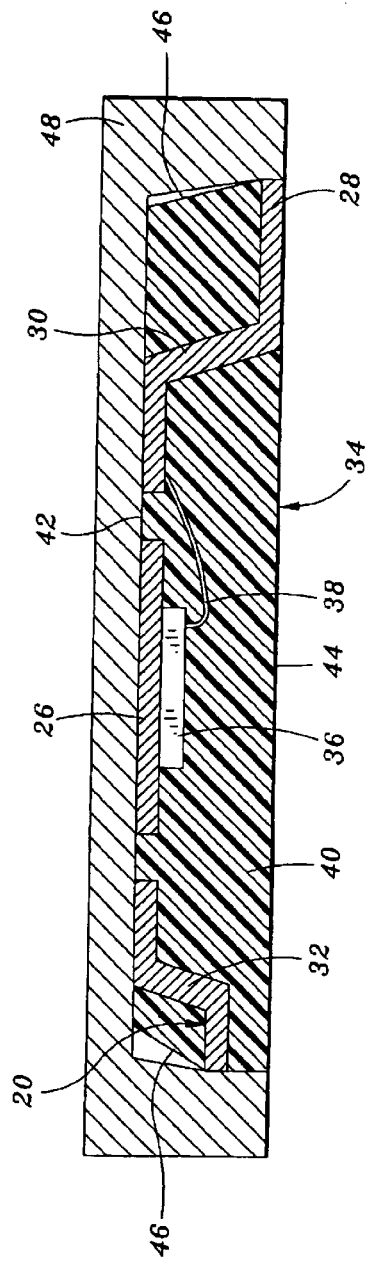

DOUBLE DOWNSET DOUBLE DAMBAR SUSPENDED LEADFRAME

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

The present invention relates generally to memory cards and, more particularly, to a memory card (e.g., a multi-media card (MMC)) comprising a leadframe which, in its original state, is provided with multiple downsets and multiple dambars which allow the tie bars of the leadframe to exit the body of the memory card at or near the center thereof, thus providing a more robust memory card that is less sensitive to "chip-out".

As is well known in the electronics industry, memory cards are being used in increasing numbers to provide memory storage and other electronic functions for devices such as digital cameras, MP3 players, cellular phones, and personal digital assistants. In this regard, memory cards are provided in various formats, including multi-media cards and secure digital cards.

Typically, memory cards comprise multiple integrated circuit devices or semiconductor dies. The dies are interconnected using a circuit board substrate which adds to the weight, thickness, stiffness and complexity of the card. Memory cards also include electrical contacts for providing an external interface to an insertion point or socket. These electrical contacts are typically disposed on the back side of the circuit board substrate, with the electrical connection to the dies being provided by vias which extend through the circuit board substrate.

In an effort to simplify the process steps needed to fabricate the memory card, there has been developed by Applicant a memory card wherein a leadframe assembly is used as an alternative to the circuit board substrate, as described in Applicant's co-pending U.S. application Ser. No. 09/956,190 entitled LEAD-FRAME METHOD AND ASSEMBLY FOR INTERCONNECTING CIRCUITS WITHIN A CIRCUIT MODULE filed Sep. 19, 2001, the disclosure of which is incorporated herein by reference. As is described in Ser. No. 09/956,190, the leadframe and semiconductor die of the memory card are covered with an encapsulant which hardens into a cover or body of the memory card. The body is sized and configured to meet or achieve a "form factor" for the memory card. In the completed memory card, the contacts of the leadframe are exposed within a common surface of the body, with a die pad of the leadframe and the semiconductor die mounted thereto being disposed within or covered by the body.

Applicant has previously determined that the molding or encapsulation process used to form the body of the card sometimes gives rise to structural deficiencies or problems within the resultant memory card. These problems include portions of the die pad of the leadframe being exposed in the body of the memory card, flash being disposed on the contacts of the leadframe, chipping in a peripheral flange area of the body, and mold gate pull-out wherein a portion of the mold or encapsulating compound is pulled out from within the body, leaving a small recess or void therein. To address these particular problems, Applicant has previously developed a memory card having a "die down" configuration attributable to the structural attributes of the leadframe included therein, and an associated molding methodology employed in the fabrication of such memory card. This die-down memory card is disclosed in Applicant's co-pending U.S. application Ser. No. 10/266,329 entitled DIE DOWN MULTI-MEDIA CARD AND METHOD OF MAKING SAME filed Oct. 8, 2002, the disclosure of which is also incorporated herein by reference.

Applicant has also determined that the molding or encapsulation process used to form the body of the memory card sometimes results in portions of one or more of the tie bars of the leadframe being exposed in the body of the memory card. Such exposure sometimes occurs as a result of the deflashing process used to clean the contacts of the leadframe subsequent to the completion of the molding or encapsulation process used to form the body of the memory card. When one or more of the tie bars of the leadframe is/are exposed in the body of the memory card, the cutting or singulation of the tie bars as occurs to complete the fabrication of the memory card often results in occurrences of "chip-out" in the body at the location wherein the tie bar(s) exits the same. The present invention addresses this particular problem by providing a leadframe which includes multiple downsets and dambars, thus allowing the tie bars to exit the memory card body at or near its center. The two separate dambars of the leadframe (an inner dambar and an outer dambar) are each downset to a different elevation, with the elevation being designed so that the tie bars exit the body of the memory card near the center thereof, thus providing a more robust memory card that is less sensitive to chip-out. These and other attributes of the present invention will be described in more detail below.

BRIEF SUMMARY OF THE INVENTION

In accordance with the present invention, there is provided a leadframe which is provided with multiple downsets and multiple dambars configured to allow the tie bars of the leadframe to exit the body of a memory card constructed through the use of the leadframe at or near the center of the body. The two separate dambars (an inner dambar and an outer dambar) of the leadframe are each downset to a different elevation. The relative elevations of the dambars are designed so that the tie bars of the leadframe exit the body of the memory card near the center of the body as indicated above, thus providing a more robust memory card that is less sensitive to chip-out.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIG. 3 is a cross-sectional view of a circuit module constructed through the use of the leadframe of the present invention, the leadframe being shown in an unsingulated state; and FIG. 4 is a cross-sectional view of the memory card shown in FIG. 1 constructed through the use of the circuit module shown in FIG. 3 subsequent to the singulation of the leadframe thereof.

Common reference numerals are used throughout the drawings and detailed description to indicate like elements.

DETAILED DESCRIPTION OF THE INVENTION

Figure 1:
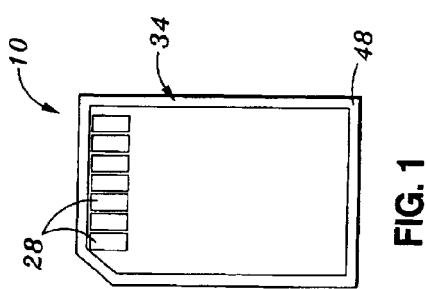
FIG. 1 is a bottom plan view of a memory card having a leadframe which is formed to include multiple downsets and dambars in accordance with the present invention.

Referring now to the drawings wherein the showings are for purposes of illustrating a preferred embodiment of the present invention only, and not for purposes of limiting the same, FIG. 1 depicts a memory card 10 which includes a leadframe 12 (shown in FIG. 2) constructed in accordance with the present invention. The leadframe 12 is shown in a preliminary, unbent and unsingulated state in FIG. 2, and in its final, singulated state in FIG. 4. As shown in FIG. 1, the memory card 10 has a form factor particularly suited for use in a multi-media card memory application. However, those of ordinary skill in the art will recognize that the memory card 10 may have alternative memory card formats, including those of secured digital cards (SDC), compact flash (CF), memory stick, and other small form factor memory cards.

In its preliminary, unbent and unsingulated state, the leadframe 12 of the memory card 10 comprises an outer frame or dambar 14. The outer dambar 14 has a generally rectangular configuration defining an opposed pair of longitudinal sides or segments 16 and an opposed pair of lateral sides or segments 18. In addition to the outer dambar 14, the leadframe 12 includes an inner frame or dambar 20 which is disposed within the interior of the outer dambar 14. The inner dambar 20 itself defines an opposed pair of longitudinal sides or segments 22 and a lateral side or segment 24. The longitudinal sides 22 of the inner dambar 20 extend in spaced, generally parallel relation to the longitudinal sides 16 of the outer dambar 14, and are each integrally connected to a common lateral side 18 of the outer dambar 14.

Figure 2:
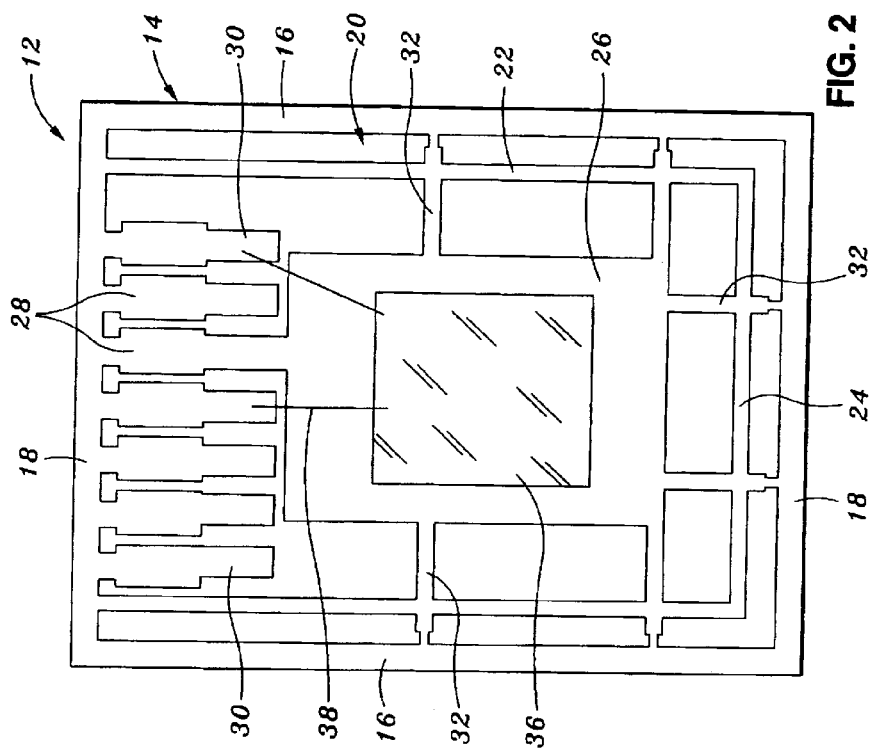
FIG. 2 is a bottom plan view of a leadframe formed to include multiple dambars in accordance with the present invention, the leadframe being shown in a preliminary, unbent and unsingulated state.

The leadframe 12 further includes a die attach area or die pad 26 which is disposed within the interior of the inner dambar 20. The die pad 26 defines opposed, generally planar top and bottom surfaces. Integrally connected to and extending from that lateral side 18 of the outer dambar 14 to which the longitudinal sides 22 of the inner dambar 20 are attached is a plurality of contacts 28 of the leadframe 12. Each of the contacts 28 also defines opposed, generally planar top and bottom surfaces. Integrally connected to and extending from each of the contacts 28 is a conductive trace 30. The traces 30 terminate in close proximity to the die pad 26. Tie bars 32 are used to integrally connect the die pad 26 to the longitudinal sides 16, 22 of the outer and inner dambars 14, 20, and to the lateral sides 18, 24 of the outer and inner dambars 14, 20 which are disposed furthest from the contacts 28. As shown in FIG. 2, one or more of the conductive traces 30 may be integrally connected to the die pad 26.

Included in the memory card 10 shown in FIG. 1 is a circuit module 34 shown in FIG. 3. The circuit module 34 itself includes the leadframe 12. Prior to being incorporated into the circuit module 34, the leadframe 12 is transitioned from the unbent state shown in FIG. 2 to the bent state shown in FIG. 3, in a manner which will be described in more detail below. In addition to the leadframe 14, the circuit module 34 includes a semiconductor die 36. Included on the top surface of the semiconductor die 36 is a plurality of pads or terminals. In the circuit module 34, the bottom surface of the semiconductor die 36 (i.e., the surface opposite that including the terminals) is attached to the bottom surface of the die pad 26. Such attachment is preferably facilitated through the use of an epoxy or adhesive. Subsequent to such attachment, the terminals of the semiconductor die 36 are electrically connected to one or more of the traces 30 and/or the die pad 26 through the use of conductive wires 38 or equivalent standard interconnect technology (e.g., flip chip, solder attach, etc.). In this regard, the conductive wires 38 effectively place the terminals of the semiconductor die 36 into electrical communication with the leadframe 12 and, more particularly, to one or more of the contacts 28 thereof.

Subsequent to the electrical connection of the semiconductor die 36 to the leadframe 12 in the above-described manner, the leadframe 12 is subjected to a bending operation wherein each of the traces 30 is bent so as to facilitate the creation of an angled or sloped portion therein which is located between the contacts 28 and the die pad 26 as shown in FIG. 3. The bending of the traces 30 removes the contacts 28 from their original co-planar relationship to the die pad 26, thus resulting in the contacts 28 and die pad 26 extending along respective areas of a pair of spaced, generally parallel planes as further shown in FIG. 3.

In addition to the traces 30 being bent in the above-described manner, the bending operation to which the leadframe 12 is subjected also facilitates the bending of each of the tie bars 32 in a manner facilitating the formation of a pair of downsets therein. More particularly, each of the tie bars 32 is bent in a manner facilitating the creation of an outer angled or sloped portion which extends between the outer dambar 14 and the inner dambar 20, and an inner angled or sloped portion which extends between the inner dambar 20 and the die pad 26, as is also shown in FIG. 3. Thus, as a result of such bending, the die pad 26 and outer dambar 14 extend along respective ones of a spaced, generally parallel pair of planes, with the inner dambar 20 itself extending along a plane which is disposed between and generally parallel to the planes of the die pad 26 and outer dambar 14. When the leadframe 12 is in its final bent state, the bottom surfaces of the contacts 28 and the bottom surface of the outer dambar 14 extend in generally co-planar relation to each other. In the fully bent leadframe 12, the entirety of the inner dambar 20 does not extend along the plane disposed between and parallel to the planes of the die pad 26 and outer dambar 14. In this regard, a section of each of the longitudinal sides 22 of the inner dambar 20 disposed in close proximity to the lateral side 18 to which it is connected is preferably bent to include inner and outer sloped portions identical to those formed in each of the tie bars 32. The bending of the leadframe 12 in the above-described manner may occur either prior to the attachment of the semiconductor die 36 to the die pad 26 or subsequent to the extension of the conductive wires 38 between the terminals of the semiconductor die 36 and the traces 30.

Subsequent to the bending of the leadframe 12, an encapsulant material is applied to the leadframe 12, the semiconductor die 36, and conductive wires 38. The encapsulant material is preferably a plastic (e.g., thermoset, thermoplastic) which, upon hardening, forms a body 40 of the circuit module 34. The completely formed body 40 defines a generally planar top surface 42, an opposed, generally planar bottom surface 44, and angled or sloped side surfaces 46. In the circuit module 34, the body 40 is formed such that the bottom surfaces of the contacts 28 are exposed in and substantially flush with the bottom surface 44 of the body 40. The body 40 is also formed such that the top surface of the die pad 26 (i.e., the surface opposite that including the semiconductor die 36 attached thereto) is exposed in and substantially flush with the top surface 42 of the body 40. However, the top surface of the die pad 26 may optionally be covered with a thin layer of the encapsulant material, and thus completely covered by and disposed within the body 40. Prior to the singulation of the leadframe 12 within the circuit module 34, portions of the outer sloped portions of the tie bars 32 are exposed in respective side surfaces 46 of the body 40. Also exposed in a side surface 46 of the body 40 are portions of the outer sloped portions of the longitudinal sides 22 of the inner dambar 20. The outer dambar 14 is not covered by the body 40, and is thus exposed.

Subsequent to the formation of the body 40, the leadframe 12 is cut or singulated, two of the cutting or singulation lines S being shown in FIG. 3. The singulation of the leadframe 12 facilitates the removal of the outer dambar 14 as is needed to electrically isolate the contacts 28 from each other. The singulation process also removes those portions of the outer sloped portions of the tie bars 32 and longitudinal sides 22 of the inner dambar 20 which protrude from respective sides 46 of the body 40. As indicated above, the body 40 is formed on the leadframe 12 such that the outer dambar 14 remains completely exposed (i.e., is not covered by the body 40). Upon the completion of the cutting or singulation process, severed distal ends of the tie bars 32 and longitudinal sides 22 of the inner dambar 20 are exposed within respective sides 46 of the body 40. Such severed distal ends are located at or near the center of a respective side 46 of the body 40. The circuit module 34 is shown in FIG. 4 subsequent to the singulation of the leadframe 12 in the above-described manner.

In the completed circuit module 34, the semiconductor die 36 is in a "die down" configuration. More particularly, the semiconductor die 36 is directed downwardly within the circuit module 34 since it is located between the bottom surface of the die pad 26 and the bottom surface 44 of the body 40. As indicated above, the bottom surfaces of the contacts 28 are exposed in the bottom surface 44 of the body 40, and define the connector of the memory card 10.

The leadframe 12 is preferably fabricated from a conductive metal material (e.g., copper) through either a chemical etching or mechanical stamping process. Those of ordinary skill in the art will recognize that the leadframe 12 may be formed to include any number of contacts 28 depending on the desired application for the memory card 10. Along these lines, the leadframe 12 may further be alternatively configured to define more than one die pad for accommodating differing numbers of semiconductor dies alone or in combination with other devices such as passive devices. Further, more than one semiconductor die and/or one or more other devices can be attached to a single die pad, or to respective ones of multiple die pads. The pattern of the conductive traces 30 may also be varied depending upon the number and arrangement of die pads and the number of semiconductor dies and/or other passive devices included in the memory card 10. Thus, the configuration of the leadframe 12 as shown in FIG. 2 is exemplary only, in that the number and arrangement of die pads, contacts, and conductive traces may be varied as needed to satisfy the requirements of a particular application.

In addition to the completed circuit module 34, the memory card 10 of the present invention comprises a lid or skin 48. The skin 48 is attached to the body 40 of the circuit module 34 in the manner shown in FIG. 4. The skin 48 is formed to include angled surfaces, the slopes of which are complementary to respective ones of the side surfaces 46 of the body 40, thus achieving a mating engagement therebetween. The attachment of the skin 48 to the circuit module 34 is preferably accomplished through the use of an adhesive. The attachment of the skin 48 to the circuit module 34 imparts to the completed memory card 10 a desired or prescribed form factor. When the skin 48 is attached to the circuit module 34, the top surface 42 of the body 40 is completely covered or shielded by the skin 48. Thus, due to the orientation of the semiconductor die 36 in the above-described die down configuration, the exposure of the top surface of the die pad 26 within the top surface 42 of the body 40 is of no consequence since such exposed top surface of the die pad 26 is also covered by the skin 48.

As indicated above, the memory card 10 has the form factor of a multi-media card. As also indicated above, the circuit module 34 may be employed in a memory card format other than a multi-media card format. For example, the circuit module 34 can be incorporated into a secure digital card format. Additionally, it is contemplated that the skin 48 may be completely eliminated from the memory card 10, with the body 40 of the circuit module 34 being molded in a manner achieving a desired form factor.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A leadframe comprising:
    a outer dambar defining a central opening;
    an inner dambar disposed within the central opening;
    a plurality of contacts disposed within the central opening and attached to the outer dambar;
    at least one die pad disposed within the central opening
    a plurality of conductive traces extending from respective ones of the contacts toward the die pad; and
    at least one tie bar attached to and extending between the die pad and each of the outer and inner dambars, the tie bar having at least two downsets formed therein such that the die pad, the outer dambar, and the inner dambar extend along respective ones of three spaced, generally parallel planes, the plane of the inner dambar being disposed between the planes of the die pad and the outer dambar.

2. The leadframe of claim 1 wherein the tie bars are bent such that the contacts extend along the plane of the outer dambar.

3. The leadframe of claim 1 comprising a plurality of tie bars attached to and extending between the die pad and each of the outer and inner dambars, each of the tie bars having at least two downsets formed therein.

4. The leadframe of claim 1 wherein:
    the outer dambar defines an opposed pair of longitudinal sides and an opposed pair of lateral sides; and
    the contacts are attached to one of the lateral sides of the outer dambar.

5. The leadframe of claim 4 wherein:
    the inner dambar defines an opposed pair of longitudinal sides and one lateral side, the longitudinal sides of the inner dambar being attached to one of the lateral sides of the outer dambar; and
    each of the longitudinal sides of the inner dambar includes at least two downsets formed therein having the same size and configuration as the downsets formed in the tie bar.

6. A memory card comprising:
a leadframe having:
- a plurality of contacts;
- at least one die pad defining opposed top and bottom surfaces;
- a plurality of conductive traces extending from respective ones of the contacts toward the die pad; and
- at least one tie bar extending from the die pad and defining a distal end;

at least one semiconductor die attached to the die pad and electrically connected to at least one of the traces; and a body at least partially encapsulating the leadframe and the semiconductor die, the body defining opposed top and bottom surfaces and multiple side surfaces, the contacts being exposed in the bottom surface and the distal end of the tie bar being exposed in and substantially flush with one of the side surfaces and oriented in spaced relation to each of the top and bottom surfaces.

7. The memory card of claim 6 wherein the traces and the tie bar are each bent in a manner such that the die pad and the contacts extend along respective ones of spaced, generally parallel planes.

8. The memory card of claim 7 wherein the leadframe further comprises:
- an inner dambar which is covered by the body, the tie bar being attached to and extending between the inner dambar and the die pad;
- the tie bar being bent such that the contacts, the inner dambar, and the die pad extend along respective ones of three spaced, generally parallel planes, the plane of the inner dambar being disposed between the planes of the die pad and the contacts.

9. The memory card of claim 8 wherein the semiconductor die is attached to the bottom surface of the die pad so as to extend along a die plane which is disposed between and generally parallel to the planes of the inner darnbar and the die pad.

10. The memory card of claim 6 further in combination with a skin attached to the body in a manner covering the top surface thereof.

11. The memory card of claim 10 wherein the top surface of the die pad is exposed in and substantially flush with the top surface of the body, and covered by the skin.

12. A memory card comprising:
a leadframe having:
- an inner dambar defining a central opening;
- a plurality of contacts extending into the central opening;
- at least one die pad disposed within the central opening and defining opposed top and bottom surfaces;
- a plurality of conductive traces extending from respective ones of the contacts toward the die pad; and
- at least one tie bar attached to and extending between the die pad and the inner dambar, the tie bar defining a distal end;

at least one semiconductor die attached to the die pad and electrically connected to at least one of the traces; and a body at least partially encapsulating the lead frame and the semiconductor die, the body defining opposed top and bottom surfaces and multiple side surfaces, the contacts being exposed in the bottom surface and the distal end of the tie bar being exposed in and substantially flush with one of the side surfaces and oriented in spaced relation to each of the top and bottom surfaces.

13. The memory card of claim 12 wherein the traces and the tie bar are each bent in a manner such that the contacts, the inner dambar, and the die pad extend along respective ones of three spaced, generally parallel planes, the plane of the inner dambar being disposed between the planes of the die pad and the contacts.

14. The memory card of claim 13 wherein the semiconductor die is attached to the bottom surface of the die pad so as to extend along a die plane which is disposed between and generally parallel to the planes of the inner dambar and the die pad.

15. The memory card of claim 12 further in combination with a skin attached to the body in a manner covering the top surface thereof.

16. The memory card of claim 15 wherein the top surface of the die pad is exposed in and substantially flush with the top surface of the body, and covered by the skin.

* * * * *